United States Patent
Bruce et al.

(10) Patent No.: US 7,128,950 B2
(45) Date of Patent: Oct. 31, 2006

(54) ELECTRON BEAM PHYSICAL VAPOR DEPOSITION PROCESS

(75) Inventors: Robert William Bruce, Loveland, OH (US); John Douglas Evans, Sr., Springfield, OH (US)

(73) Assignee: General Electric Company, Schenectady, NY (US)

( * ) Notice: Subject to any disclaimer, the term of this patent is extended or adjusted under 35 U.S.C. 154(b) by 113 days.

(21) Appl. No.: 10/754,419

(22) Filed: Jan. 8, 2004

(65) Prior Publication Data

US 2004/0211363 A1 Oct. 28, 2004

Related U.S. Application Data

(62) Division of application No. 09/624,810, filed on Jul. 24, 2000, now Pat. No. 6,983,718.

(60) Provisional application No. 60/147,232, filed on Aug. 4, 1999.

(51) Int. Cl.
*C23C 14/30* (2006.01)

(52) U.S. Cl. ................. 427/595; 427/596; 427/597

(58) Field of Classification Search ............. 427/596, 427/597
See application file for complete search history.

(56) References Cited

U.S. PATENT DOCUMENTS

| | | | | |
|---|---|---|---|---|
| 3,526,206 A | * | 9/1970 | Jones | 118/726 |
| 4,401,719 A | * | 8/1983 | Kobayashi et al. | 428/457 |
| 4,988,844 A | * | 1/1991 | Dietrich et al. | 219/121.17 |
| 5,698,273 A | * | 12/1997 | Azad et al. | 427/566 |
| 5,726,919 A | * | 3/1998 | Azad et al. | 716/21 |
| 5,773,078 A | * | 6/1998 | Skelly | 427/126.3 |
| 5,834,070 A | * | 11/1998 | Movchan et al. | 427/566 |
| 6,589,351 B1 | * | 7/2003 | Bruce et al. | 118/726 |
| 6,620,465 B1 | * | 9/2003 | Rigney et al. | 427/567 |
| 6,770,333 B1 | * | 8/2004 | Bruce et al. | 427/596 |
| 6,849,299 B1 | * | 2/2005 | Corderman et al. | 427/250 |
| 6,863,937 B1 | * | 3/2005 | Bruce et al. | 427/566 |
| 2005/0208337 A1 | * | 9/2005 | Ulion et al. | 428/698 |
| 2006/0055321 A1 | * | 3/2006 | Maldonado et al. | 313/527 |

* cited by examiner

*Primary Examiner*—Bret Chen
(74) *Attorney, Agent, or Firm*—David L. Narciso; Gary M. Hartman; Domenica N. S. Hartman

(57) ABSTRACT

An electron beam physical vapor deposition (EBPVD) process performed with a coating apparatus to produce a coating material (e.g., a ceramic thermal barrier coating) on an article. The EBPVD apparatus generally includes a coating chamber operated at an elevated temperature and a subatmospheric pressure. The coating chamber contains a crucible and a coating material surrounded by and contained within the crucible, and the coating material has a surface exposed by the crucible. The process entails projecting an electron beam onto the surface of the coating material, wherein the electron beam defines a beam pattern having a higher intensity at an interface of the surface of the coating material with the crucible than at a central region of the surface of the coating material.

12 Claims, 11 Drawing Sheets

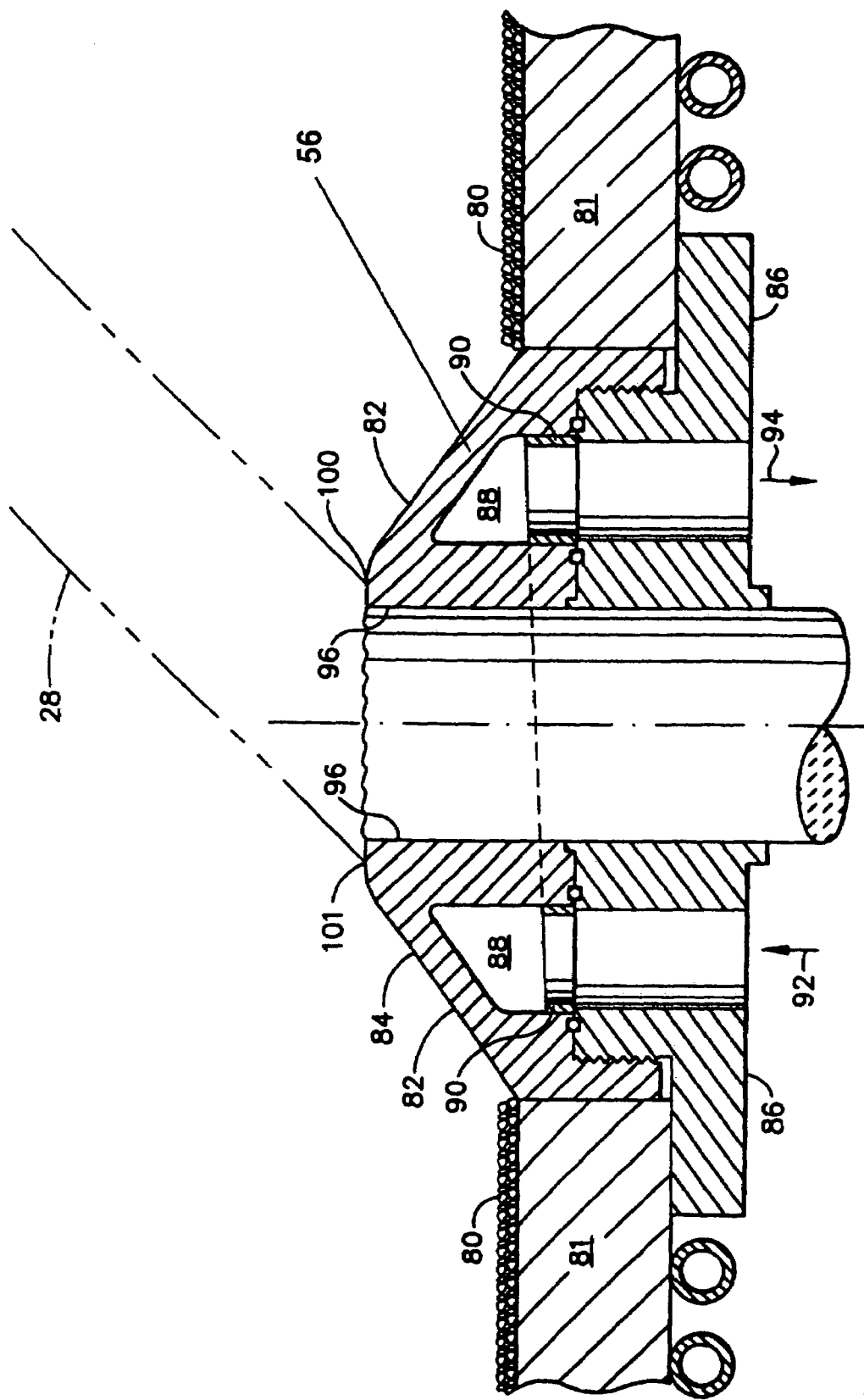

ELECTRON BEAM PHYSICAL VAPOR DEPOSITION PROCESS

This application is a divisional patent application of U.S. patent application Ser. No. 09/624,810, filed Jul. 24, 2000, now U.S. Pat. No. 6,983,718.

This application claims benefit of Provisional Patent Application No. 60/147,232, filed Aug. 4, 1999, which is hereby incorporated by reference.

FIELD OF THE INVENTION

This invention generally relates to an electron beam physical vapor deposition coating apparatus. More particularly, this invention is directed to such a coating apparatus adapted to deposit ceramic coatings on components, such as thermal barrier coatings on superalloy components of gas turbine engines.

BACKGROUND OF THE INVENTION

Higher operating temperatures for gas turbine engines are continuously sought in order to increase their efficiency. However, as operating temperatures increase, the high temperature durability of the components of the engine must correspondingly increase. While significant advances have been achieved with iron, nickel and cobalt-base superalloys, the high-temperature capabilities of these alloys alone are often inadequate for components located in certain sections of a gas turbine engine, such as the turbine, combustor and augmentor. A common solution is to thermally insulate such components in order to minimize their service temperatures. For this purpose, thermal barrier coatings (TBC) formed on the exposed surfaces of high temperature components have found wide use.

To be effective, thermal barrier coatings must have low thermal conductivity and adhere well to the component surface. Various ceramic materials have been employed as the TBC, particularly zirconia ($ZrO_2$) stabilized by yttria ($Y_2O_3$), magnesia (MgO) or other oxides. These particular materials are widely employed in the art because they can be readily deposited by plasma spray and vapor deposition techniques. An example of the latter is electron beam physical vapor deposition (EBPVD), which produces a thermal barrier coating having a columnar grain structure that is able to expand with its underlying substrate without causing damaging stresses that lead to spallation, and therefore exhibits enhanced strain tolerance. Adhesion of the TBC to the component is often further enhanced by the presence of a metallic bond coat, such as a diffusion aluminide or an oxidation-resistant alloy such as MCrAlY, where M is iron, cobalt and/or nickel.

Processes for producing TBC by EBPVD generally entail preheating a component to an acceptable coating temperature, and then inserting the component into a heated coating chamber maintained at a pressure of about 0.005 mbar. Higher pressures are avoided because control of the electron beam is more difficult at pressures above about 0.005 mbar, with erratic operation being reported at coating chamber pressures above 0.010 mbar. It has also been believed that the life of the electron beam gun filament would be reduced or the gun contaminated if operated at pressures above 0.005 mbar. The component is supported in proximity to an ingot of the ceramic coating material (e.g., YSZ), and an electron beam is projected onto the ingot so as to melt the surface of the ingot and produce a vapor of the coating material that deposits onto the component.

The temperature range within which EBPVD processes can be performed depends in part on the compositions of the component and the coating material. A minimum process temperature is generally established to ensure the coating material will suitably evaporate and deposit on the component, while a maximum process temperature is generally established to avoid microstructural damage to the article. Throughout the deposition process, the temperature within the coating chamber continues to rise as a result of the electron beam and the presence of a molten pool of the coating material. As a result, EBPVD coating processes are often initiated near the targeted minimum process temperature and then terminated when the coating chamber nears the maximum process temperature, at which time the coating chamber is cooled and cleaned to remove coating material that has deposited on the interior walls of the coating chamber. Advanced EBPVD apparatuses permit removal of coated components from the coating chamber and replacement with preheated uncoated components without shutting down the apparatus, so that a continuous operation is achieved. The continuous operation of the apparatus during this time can be termed a "campaign," with greater numbers of components successfully coated during the campaign corresponding to greater processing and economic efficiencies.

In view of the above, there is considerable motivation to increase the number of components that can be coated within a single campaign, reduce the amount of time required to introduce and remove components from the coating chamber, and reduce the amount of time required to perform maintenance on the apparatus between campaigns. However, limitations of the prior art are often the result of the relatively narrow range of acceptable coating temperatures, the complexity of moving extremely hot components into and out of the coating chamber, and the difficulties confronted when maintaining an advanced EBPVD apparatus. Accordingly, improved EBPVD apparatuses and processes are continuously being sought for depositing coatings, and particularly ceramic coatings such as TBCs.

BRIEF SUMMARY OF THE INVENTION

The present invention is an electron beam physical vapor deposition (EBPVD) apparatus and a method for using the apparatus to produce a coating (e.g., a ceramic thermal barrier coating) on an article. The EBPVD apparatus of this invention generally includes a coating chamber that is operable at an elevated temperature (e.g., at least 800° C.) and a subatmospheric pressure (e.g., between $10^{-3}$ mbar and $5 \times 10^{-2}$ mbar). An electron beam gun is used to project an electron beam into the coating chamber and onto a coating material within the chamber. The electron beam gun is operated to melt and evaporate the coating material. Also included is a device for supporting an article within the coating chamber so that vapors of the coating material can deposit on the article.

According to the present invention, the operation of the EBPVD apparatus can be enhanced by the inclusion or adaptation of one or more features and/or process modifications. According to one aspect of the invention relating to process temperature control, the coating chamber contains radiation reflectors that can be moved within the coating chamber to increase and decrease the amount of reflective heating that the article receives from the molten coating material during a coating campaign. Process pressure control is also an aspect of the invention, by which processing pressures of greater than 0.010 mbar can be practiced in accordance with copending U.S. patent application Ser. No. 09/108,201 to Rigney et al. (assigned to the same assignee as the present invention) with minimal or no adverse effects on the operation and reliability of the electron beam gun, and with minimal fluctuations in process pressures. Mechanical and process improvements directed to this aspect of the invention include modifications to the electron beam gun, the coating chamber, and the manner by which gases are introduced and removed from the apparatus. Also improved by this invention is the electron beam pattern on the coating material.

According to another preferred aspect of the invention, a crucible is employed to support the coating material within the coating chamber. The crucible preferably comprising at least two members, a first of which surrounds and retains a molten pool of the coating material, while the second member is secured to the first member and surrounds an unmolten portion of the coating material. The first and second members define an annular-shaped cooling passage therebetween that is closely adjacent the molten pool, so that efficient cooling of the crucible can be achieved, reducing the rate at which the process temperature increases within the coating chamber.

Another preferred aspect of the invention entails a rotatable magazine that supports multiple ingots of the coating material beneath the coating chamber. The magazine is indexed to individually align multiple stacks of one or more ingots with an aperture to the coating chamber for sequentially feeding the ingots into the coating chamber without interrupting deposition of the coating material.

According to another preferred aspect of the invention, a viewport is provided for viewing the molten coating material within the coating chamber. In order to be capable of providing a view of the extremely high-temperature process occurring within the coating chamber, the viewport is fluid-cooled and has a high rotational speed stroboscopic drum and a magnetic particle seal that provides a high-temperature vacuum seal for the stroboscopic drum. Another preferred aspect is that the viewport provides a stereoscopic view of the coating chamber, by which one or more operators can simultaneously observe the coating chamber while retaining stereoscopic vision.

Other objects and advantages of this invention will be better appreciated from the following detailed description.

BRIEF DESCRIPTION OF THE DRAWINGS

FIG. 10 is a cross-sectional view of a crucible housing an ingot of coating material and an electron beam projected onto the surfaces of the crucible and ingot in accordance with the preferred embodiment of this invention.

DETAILED DESCRIPTION OF THE INVENTION

Figure 1:
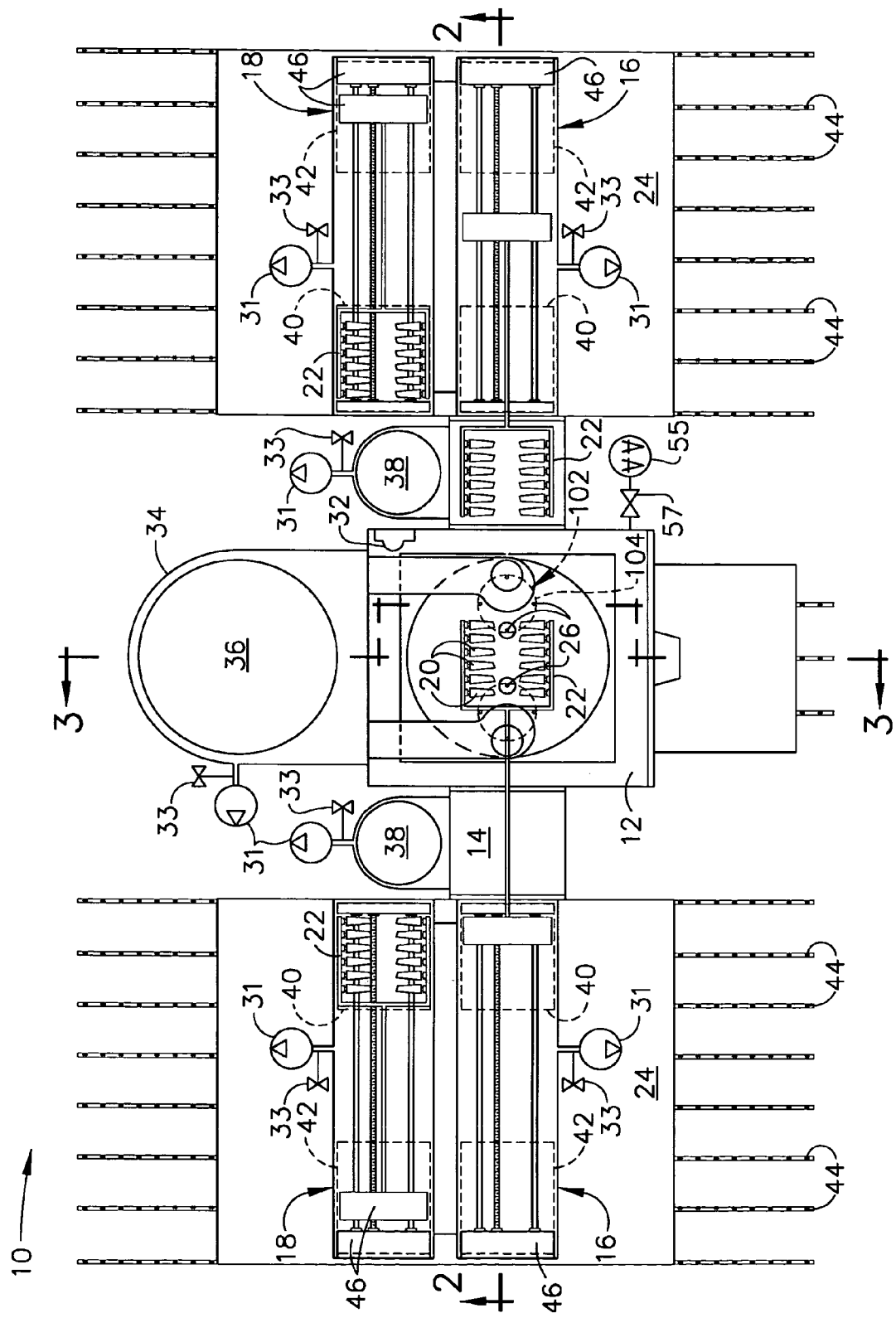
FIGS. 1 and 2 are schematic top and front views, respectively, of an electron beam physical vapor deposition apparatus used to deposit a coating material in accordance with this invention.
Figure 2:
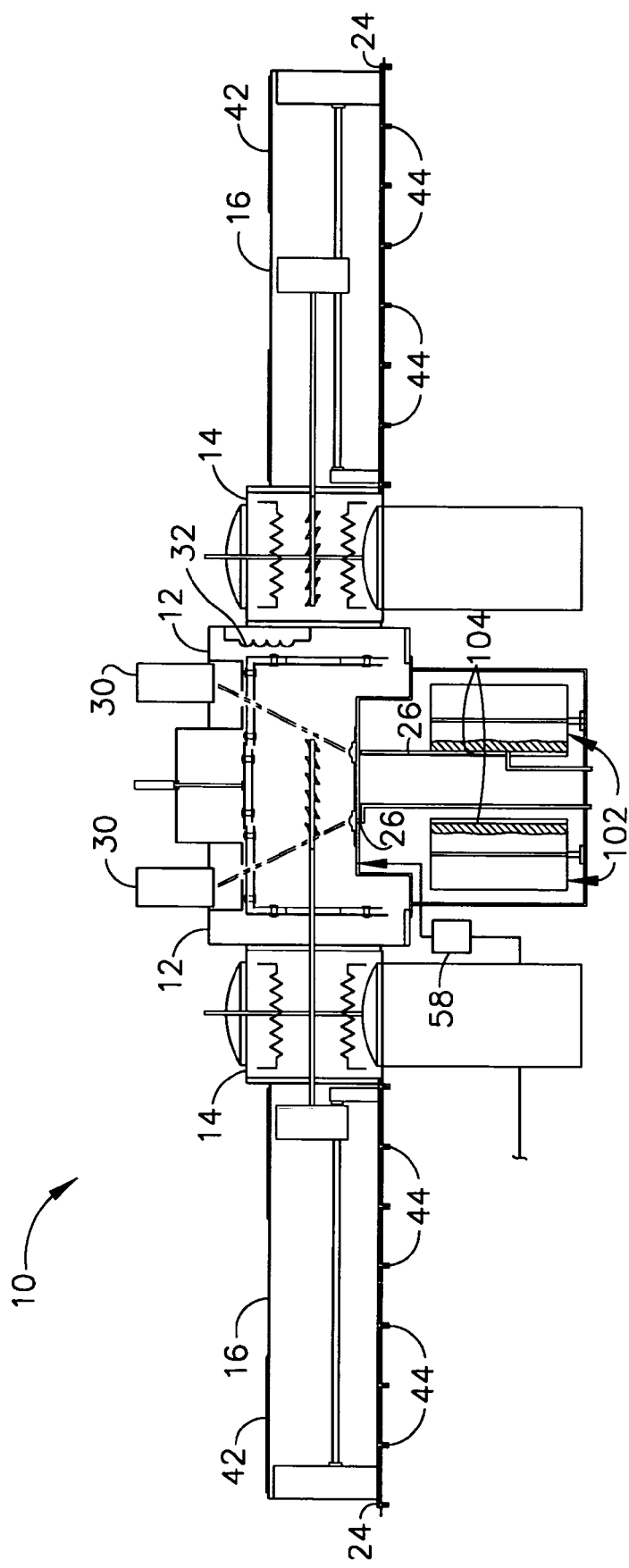

An EBPVD apparatus 10 in accordance with this invention is generally depicted in FIGS. 1 and 2, with various components and features being depicted in FIGS. 3 through 14. The apparatus 10 is particularly well suited for depositing a ceramic thermal barrier coating on a metal component intended for operation within a thermally hostile environment. Notable examples of such components include the high and low pressure turbine nozzles and blades, shrouds, combustor parts and augmentor hardware of gas turbine engines. While the advantages of this invention will be described with reference to depositing a ceramic coating on such components, the teachings of this invention can be generally applied to a variety of coating materials and components.

For purposes of illustrating the invention, the EBPVD apparatus 10 is shown in FIGS. 1 and 2 as including a coating chamber 12, a pair of preheat chambers 14, and two pairs of loading chambers 16 and 18, so that the apparatus 10 has a symmetrical configuration. The front loading chambers 16 are shown as being aligned with their respective preheat chambers 14, with parts 20 originally loaded on a rake 22 within the lefthand chamber 16 having been transferred to the preheat chamber 14 and, as depicted in FIG. 1, into the coating chamber 12. With the symmetrical configuration of the apparatus 10, while the parts 20 loaded through the front lefthand loading chamber 16 are being coated within the coating chamber 12, a second batch of parts in the front righthand loading chamber 16 can be preheated in the righthand preheat chamber 14, a third batch of parts can be loaded into the rear lefthand loading chamber 18, and a fourth batch of parts can be unloaded from the rear righthand loading chamber 18. Consequently, four process stages can occur simultaneously with the preferred EBPVD apparatus 10 of this invention.

According to a preferred embodiment of this invention, the loading chambers 16 and 18 are mounted to low-profile movable platforms 24, so that the loading chambers 16 and 18 can be selectively aligned with their preheat chambers 14. For example, when the front lefthand loading chamber 16 is brought into alignment with the lefthand preheat chamber 14 to allow the parts 20 to be inserted into the coating chamber 12, the rear lefthand loading chamber 18 is set back from the lefthand preheat chamber 14, so that parts can be simultaneously loaded or unloaded from the rake 22 of the rear lefthand loading chamber 18. Each platform 24 is also preferably movable to a maintenance position, in which neither of its loading chambers 16 and 18 is aligned with its preheat chamber 14, so that the interiors of the preheat and loading chambers 14, 16 and 18 can be accessed for cleaning. The platforms 24 are preferably supported at least in part by roller bearings 44 mounted in the floor, though it is foreseeable that a variety of bearings could be used. Each platform 24 has a low elevational profile (projection above the floor) of not more than one inch (about 2.5 cm) with a chamfered edge (preferably 30 degrees from horizontal), which together essentially eliminate the potential for an operator tripping on the edge of the platform 24. Stationary objects surrounding the apparatus 10 are preferably positioned away from the edges of the platforms 24 to avoid an operator being pinched by a platform 24 when it is repositioned. As alternatives to the platform configuration shown, platform systems with multiple overlapping or telescoping movable segments could be used. Furthermore, the movable segments could slip beneath a fixed elevated platform surrounding the platform assemblies. Finally, separate preheat chambers could be provided for the loading chambers 16 and 18, so that both loading chambers 16 and 18 and their heating chambers would be surrounded by a movable platform system.

Figure 3:
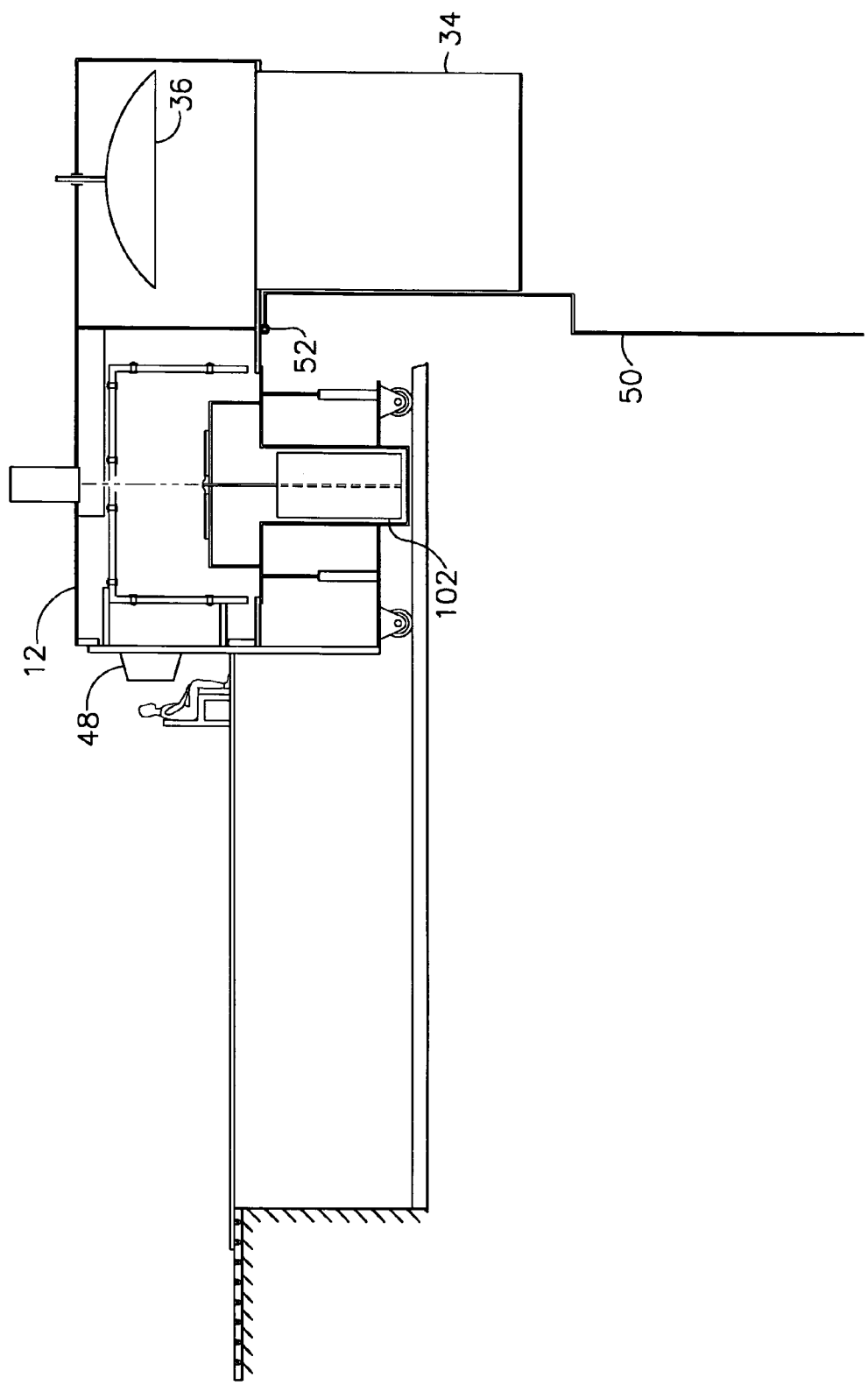
FIGS. 3, 4 and 5 are cross-sectional views taken along section line 3—3 of FIG. 1, and showing a movable platform employed in accordance with one aspect of this invention.
Figure 4:
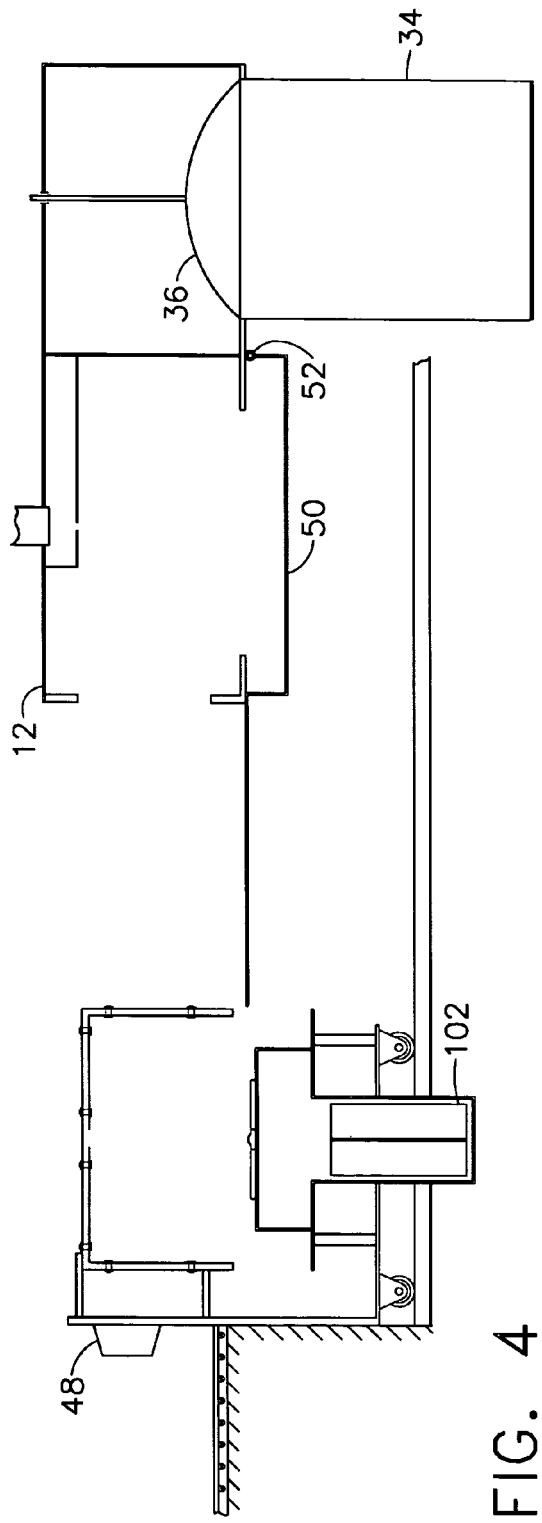
Figure 5:
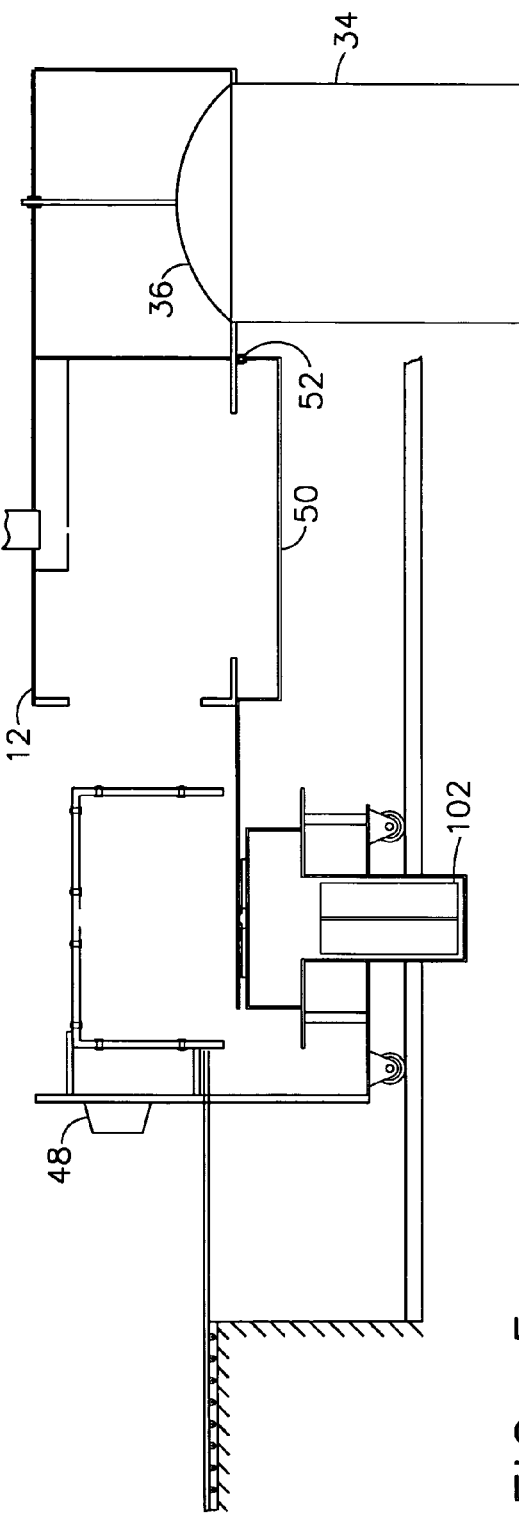

As shown in FIGS. 3 through 5, a portion of the coating chamber 12 is also preferably configured to move relative to the preheat chamber 14 in order to facilitate cleaning of the interior of the chamber 12 between coating campaigns. As seen in FIG. 3, the coating chamber 12 is in its operating position with a viewport 48, described in greater detail below, mounted to a front section of the chamber 12. In FIG. 4, the front section of the coating chamber 12 (as well as an ingot magazine 102 associated with the coating chamber 12 and discussed below) is shown as having been moved away from the remainder of coating chamber 12 in order to access a movable work platform 50, which is shown rotated into a working position in FIG. 5. In this position, the interior of the coating chamber 12 can be easily accessed by the work platform 50. The platform 50 is shown as being coupled with a hinge 53 to the base of the coating chamber 12, though it is foreseeable that other acceptable structures could be employed. The platform 50 can be configured differently from that shown in FIGS. 3 through 5, including a hinged segmented construction, and with kick plates and other safety-related accessories.

The coating, preheat and loading chambers 12, 14, 16 and 18 are connected by valves (not shown) that achieve a vacuum seal between these chambers. To maximize the size and number of parts 20 that can be loaded between the chambers 12, 14, 16 and 18, the valves preferably have a minimum dimension of about 250 mm, which is considerably larger than previously thought practical by those skilled in the art. Because the coating, preheat and loading chambers 12, 14, 16 and 18 must be pumped to varying levels of vacuum, and in some cases are required to move relative to each other as explained above, the valves must be capable of numerous cycles at relatively high pressures. Seal designs suitable for this purpose are known in the art, and therefore will not be discussed in any detail.

Figure 6:
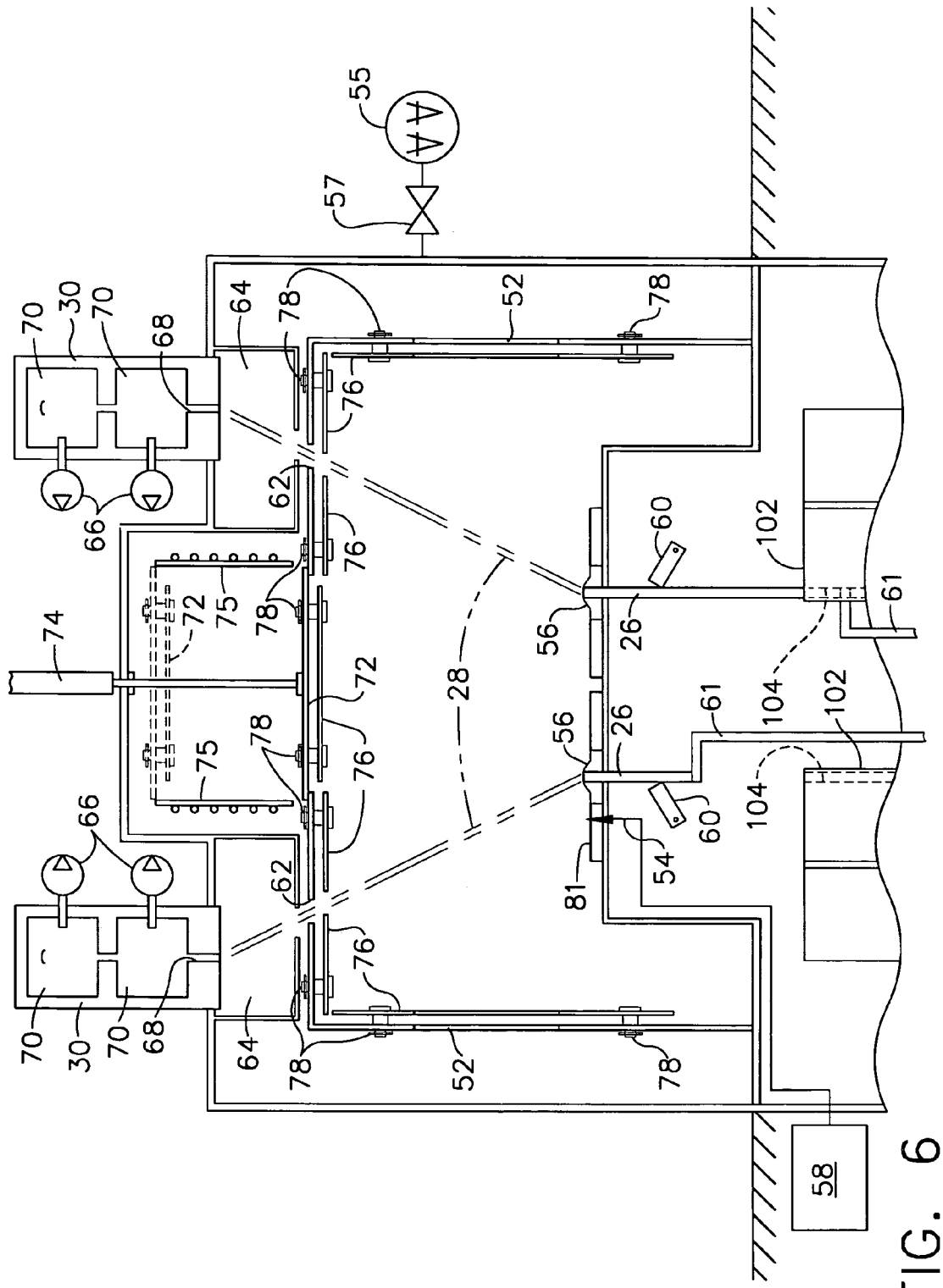
FIGS. 6 and 7 are more detailed front and top cross-sectional views, respectively, of preferred interior components for a coating chamber of the apparatus of FIGS. 1 and 2.
Figure 7:
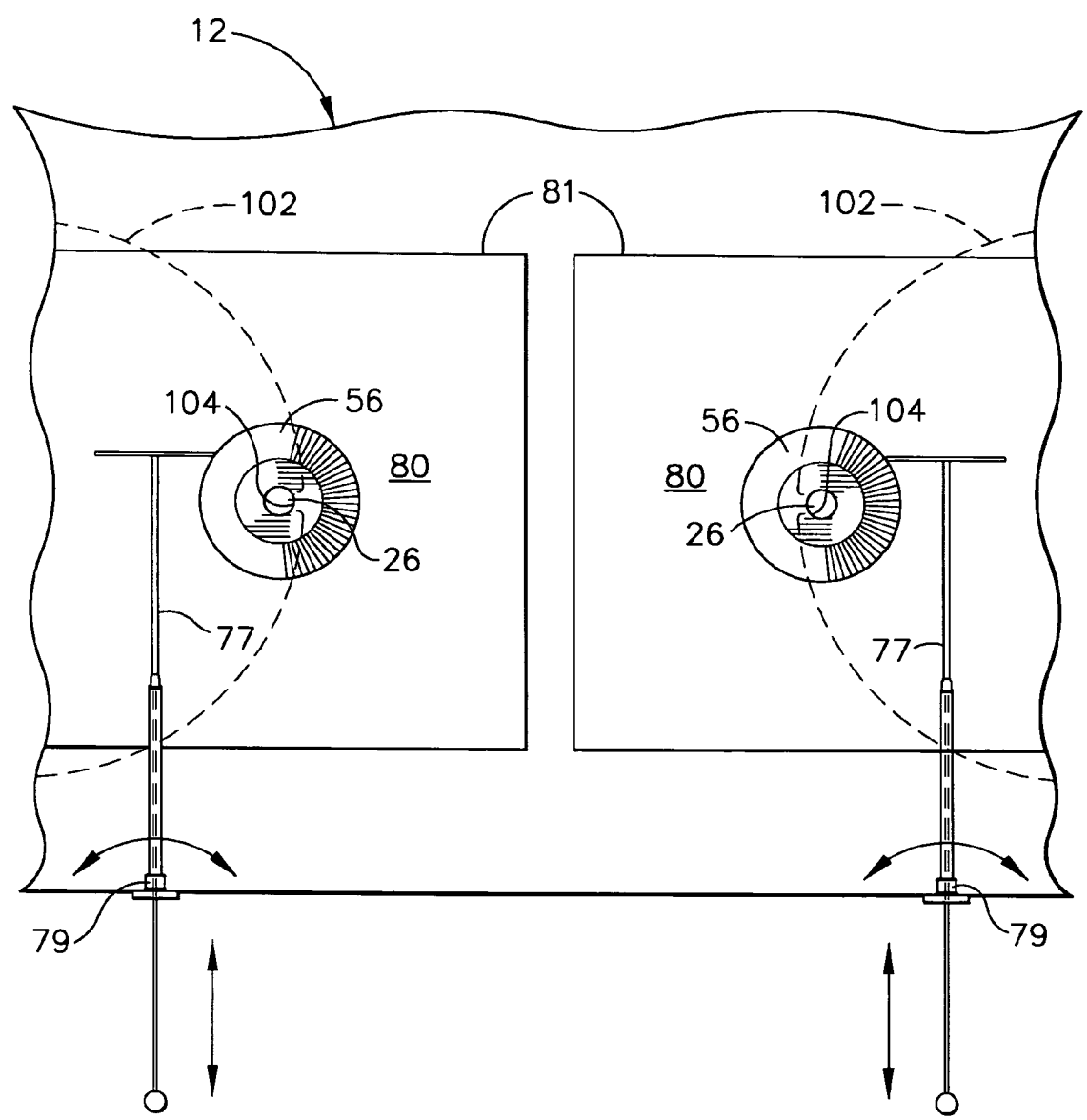

With reference to FIGS. 6 and 7, coating is performed within the coating chamber 12 by melting and evaporating ingots 26 of ceramic material with electron beams 28 produced by electron beam (EB) guns 30 and focused on the ingots 26. Intense heating of the ceramic material by the electron beams 28 causes the surface of each ingot 26 to melt, forming molten ceramic pools from which molecules of the ceramic material evaporate, travel upwardly, and then deposit on the surfaces of the parts 20, producing the desired ceramic coating whose thickness will depend on the duration of the coating process. While two ingots 26 are shown in these Figures, it is within the scope of this invention that one or more ingots 26 could be present and evaporated at any given time.

EBPVD coating chambers are typically capable of being maintained at a vacuum level of about 0.001 mbar (about $1 \times 10^{-3}$ Torr) or less. In the prior art, a vacuum of at most 0.010 mbar, and more typically about 0.005 mbar, would be drawn within the coating chamber 12 during the coating process, the reason being that higher pressures were known to cause erratic operation of the EB guns 30 and make the electron beams 28 difficult to control, with the presumption that inferior coatings would result. It has also been believed that the life of the gun filament would be reduced or the gun contaminated if operated at coating chamber pressures above 0.005 mbar. However, in accordance with copending U.S. patent application Ser. No. 09/108,201 to Rigney et al., assigned to the same assignee as this invention, the coating chamber 12 is preferably operated at higher pressures that surprisingly yield a ceramic coating with improved spallation and impact resistance, as well as promote the coating deposition rate in conjunction with higher ingot evaporation rates than that achieved in the prior art.

Rough pumpdown can be performed in the coating, preheat and loading chambers 12, 14, 16 and 18 with mechanical pumps 31. A cryogenic pump 32 of a type known in the art is shown in FIGS. 1 and 2 as being employed to aid in the evacuation of the coating chamber 12 prior to the deposition process. Also shown in FIGS. 1, 3, 4 and 5 is a diffusion pump 34 whose operation is similar to those known in the art, but modified with a throttle valve 36 to regulate the operation of the pump 34 in accordance with this invention. More particularly, the throttle valve 36 is actuated between an open position (FIG. 3) and a closed position (FIGS. 4 and 5) as well as positions therebetween. The benefit of the throttle valve 36 is realized when the vacuum within the coating chamber 12 is maintained at the relatively high pressures employed by this invention. When the maximum operating capacity of the diffusion pump 34 is required to evacuate the coating chamber 12, the throttle valve 36 is open as shown in FIG. 3. For processing hardware, the coating chamber 12 must be maintained at the targeted pressure (e.g., 0.015 mbar), necessitating that the throttle valve 36 is moved to a preset throttled position some distance from the fully closed position of FIGS. 4 and 5. As seen in FIG. 1, separate diffusion pumps 38 similarly equipped with throttle valves (not shown) are preferably employed to evacuate the preheat chambers 14, again for the reason that a relatively high pressure is desired for the coating operation of this invention. The mechanical pumps 31 preferably include leak detector connections 33 to which a leak detector can be connected for detecting a system vacuum leak using helium or another gas that can be safely introduced through leaks in the chambers 12, 14, 16 and 18, or associated equipment.

With reference again to FIGS. 1 and 2, the loading chambers 16 and 18 are generally elongated in shape, and are equipped with loading doors 40 through which parts are loaded onto the rakes 22. The loading chambers 16 and 18 are also equipped with access doors 42 to motion drives (schematically represented at 46 in FIG. 1) that control the operation of the rakes 22. More particularly, the parts 20 supported on the rakes 22 are preferably rotated and/or oscillated within the coating chamber 12 in order to promote the desired coating distribution around the parts 20. The access doors 42 allow the operator of the apparatus 10 to quickly adjust or change the settings of the motion drives 46 without interfering with loading and unloading of parts from the loading chambers 16 and 18.

Referring again to FIGS. 6 and 7, the interior of the coating chamber 12 will be described in more detail. In order to address the aforementioned problems concerning the control of the electron beams 28 and protection of the EB guns 30 at the higher coating pressures employed by this invention, certain improvements were made to the EB guns 30 and the coating chamber 12. As seen in FIG. 6, oxygen and argon gases are introduced into the coating chamber 12 through an inlet 54 located near crucibles 56 that support the ingots 26 within the coating chamber 12 and retain the molten pools of ceramic material produced by the electron beams 28. The flow rates of oxygen and argon are individually controlled based on the targeted process pressure and the targeted partial pressure of oxygen. To reduce the occurrence of pressure oscillations within the coating chamber 12, the control loop response time for these gases was reduced by physically placing the control valves 58 for the gases immediately adjacent to the inlet 54 just outside the coating chamber 12, as shown in FIGS. 1 and 6. Placement of the control valves 58 so close to the coating chamber 12 provided a surprisingly significant improvement in pressure control, reducing pressure fluctuations within the coating chamber 12 and reducing disturbances in the focus and position of the electron beams 28 on the ingots 26.

To further improve the electron beam focus and pattern, the EB guns 30 are relatively isolated from the higher coating pressure within the coating chamber 12 by a condensate hood 52 that catches most of the superfluous ceramic vapors that do not deposit onto the parts 20. The hood 52 is configured according to this invention to define a coating region around the parts 20, within which the elevated pressure desired for the coating process is specifically maintained. To facilitate cleaning between coating campaigns, the hood 52 is preferably equipped with screens 76 that can be removed and cleaned outside of the coating chamber 12. Preferably, the screens 76 are retained by spring pins 78 instead of threaded fasteners in order to simplify removal of the screens 76 when in the condition of having been coated with a layer of the coating material by the end of a campaign. Though generally more complicated, the entire condensate hood 52 could be removed and replaced with a second clean hood 52.

Because the hood 52 surrounds the parts 20 as seen in FIG. 6, an aperture 62 is necessary for each beam 28 through the hood 52. To promote the capability of maintaining higher pressures within the condensate hood 52 as compared to the remainder of the coating chamber 12, including the vicinity around the EB guns 30, the apertures 62 are preferably formed to have dimensions of not more than that necessary to allow the electron beams 28 to pass through the hood 52. For this purpose, the apertures 62 are preferably cut with the electron beams 28 during the setup of the EBPVD apparatus 10, so that each aperture 62 has a cross-sectional area that is approximately equal to that of its electron beam pattern at the intersection with the hood 52.

To further isolate the EB guns 30 from the elevated pressure within the condensate hood 52, the beams 28 travel from their respective guns 30 through chambers 64 formed between the interior walls of the coating chamber 12 and the condensate hood 52. Preferably, the diffusion pump 34 has an inlet near and pneumatically coupled to each of the chambers 64. Because of the minimum size of the apertures 62, the elevated pressure within the condensate hood 52 (achieved by the introduction of oxygen and argon with the inlet 54) bleeds into the chambers 64 at a sufficiently reduced rate to enable the diffusion pump 34 to maintain the chambers 64 at a pressure lower than that within the condensate hood 52.

Figure 9:
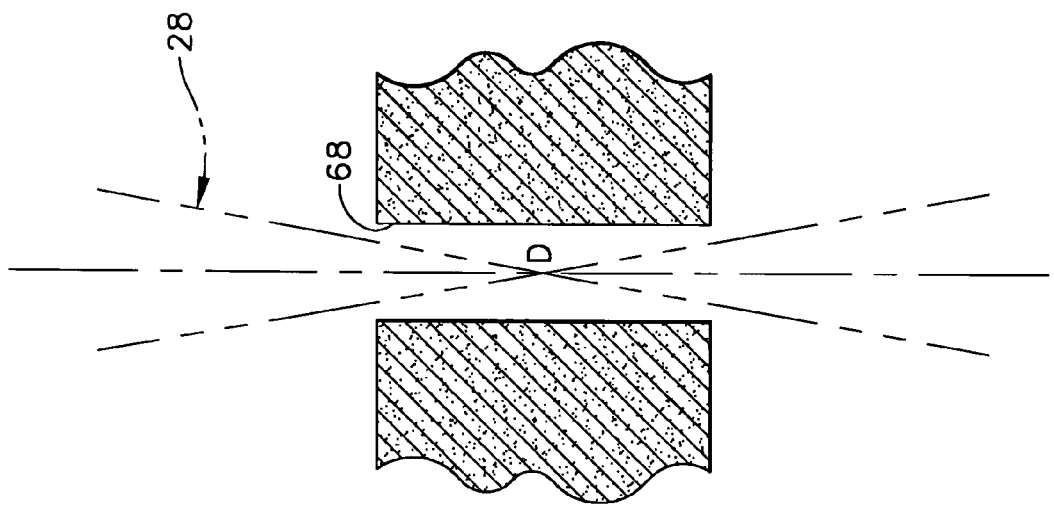
FIGS. 8 and 9 compare an EB gun orifice of the prior art and an orifice configured in accordance with the preferred embodiment of this invention.
Figure 8:
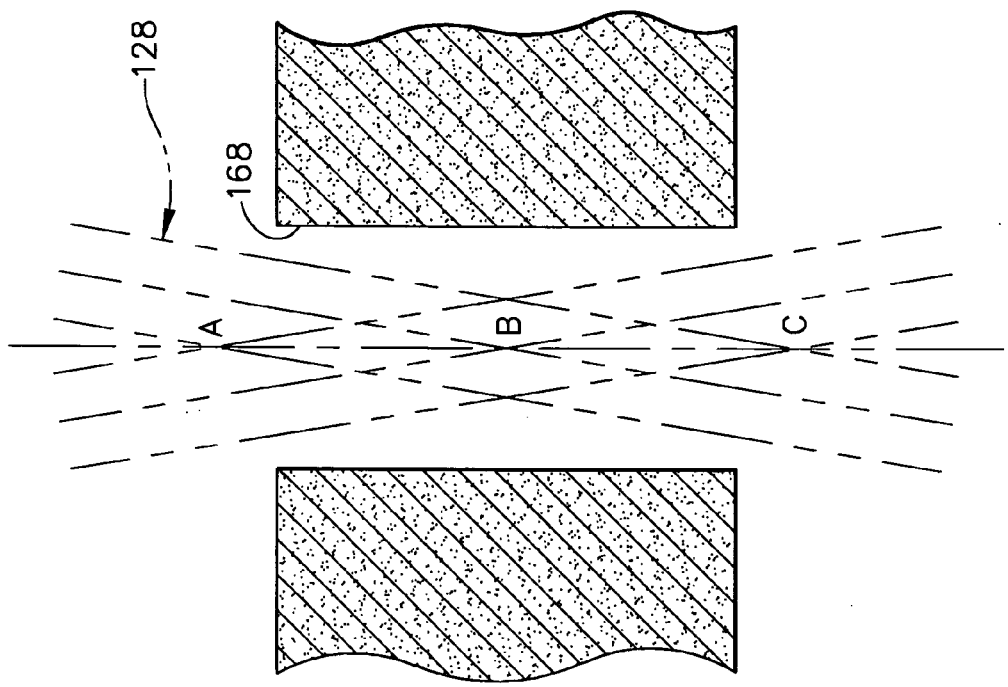

FIGS. 6, 8 and 9 illustrate additional protection provided to the EB guns 30 with this invention. As is generally conventional, the EB guns 30 are equipped with vacuum pumps 66 that maintain pressures within the internal gun chambers 70 at levels of about $8\times10^{-5}$ to about $8\times10^{-4}$ mbar, which is well below that existing outside the guns 30, i.e., within the EBPVD coating chamber 12 of this invention as well as typical EBPVD coating chambers of the prior art. In order for such low pressures to be maintained, the electron beams 28 must pass through cylindrical orifices 68 to exit the guns 30, as schematically shown in FIG. 6. FIG. 8 represents a conventional configuration for such an orifice 168. To allow for a range of beam focusing conditions represented by focus positions A, B and C for an electron beam 128 shown in FIG. 8, the orifice 168 has a relatively large diameter and length, e.g., about 30 mm and about 120 mm, respectively. The disadvantage of the prior art is the reduced protection that such a large orifice 168 can provide to the EB guns 30 operating in the higher pressure environment of the apparatus 10 of this invention. During an investigation leading to this invention, testing evidenced that improved control of processing conditions enabled an optimum position of the beam focus point (D in FIG. 9) to be identified. A more effective orifice design was then investigated, resulting in the orifice 68 of this invention shown in FIGS. 6 and 9, which is depicted in FIG. 9 as having a smaller diameter and length than that of the prior art orifice 168 of FIG. 8. A preferred diameter and length for the orifice 68 are believed to be about 15 and 50 mm, respectively, though optimum values for these dimensions can vary depending on pressures and focus, deflection coil current, and overall geometries.

As noted above, the condensate hood 52 is positioned around the parts 20 to minimize the deposition of ceramic material on the interior walls of the coating chamber 12. According to this invention, the condensate hood 52 is also specially configured to regulate heating of the parts 20 as required to maintain an appropriate part temperature during a coating campaign. More particularly, the hood 52 is equipped with a movable reflector plate 72 that radiates heat emitted by the molten surfaces of the ingots 26 back toward the parts 20. At the initial startup of a campaign, during which the temperature of the coating chamber 12 is relatively low, the reflector plate 72 is positioned close to the parts 22 with an actuator 74 to maximize heating of the parts 20. As the temperature within the coating chamber 12 rises during an ongoing campaign, the reflector plate 72 is moved away from the parts 20 (as shown in phantom in FIG. 6) to reduce the amount of radiated heat reflected back onto the parts 20. In this manner, the parts 20 can be more readily brought to a suitable deposition temperature (e.g., about 925° C.) at the start of a campaign, while attainment of the maximum allowed coating temperature (e.g., about 1140° C.) is delayed to maximize the length of the coating campaign. The hood 52 and plate 72 also promote a more uniform and stable blade coating temperature, which promotes the desired columnar grain structure for the ceramic coatings on the parts 20. To maintain the desired relatively high pressure within the condensate hood 52 while the reflector plate 72 is in the raised position, a water-cooled shroud 75 is shown that surrounds the plate 72 to inhibit gas flow between the condensate hood 52 and plate 72, and thereby reduces pressure loss between the hood 52 and plate 72.

Shown in FIG. 7 are manipulators 77 that extend into the coating chamber 12 through a ball joint feed-through 79 in the chamber wall. The manipulators 77 are used to assist in regulating the heating of the parts 20 by moving ceramic or ceramic-coated reflectors 80 (shown as a granular material in FIG. 10) toward or away from the crucibles 56 during a coating campaign. More specifically, due to their proximity to the crucibles 56, the reflectors 80 are at a very high temperature during the coating process, and therefore radiate heat upward toward the parts 20. The amount of heat radiated by the reflectors 80 is generally at a maximum when the reflectors 80 are closest to the crucibles 56, and can be reduced by moving the reflectors 80 away from the crucibles 56. The reflectors 80 are preferably supported on a fluid-cooled plate 81 that does not appreciably radiate heat to the parts 20. As a result, the reflectors 80 can be used in conjunction with the reflector plate 72 to regulate the temperature of parts 20 being coated within the coating chamber 12 during an ongoing campaign. At the beginning of a campaign, the reflectors 80 are originally located near the crucibles 56 to maximize heating of the parts 20, and later moved with the manipulators 77 away from the crucibles 56 to reduce the amount of radiated heat.

To survive the coating chamber environment, the portions of the manipulators 77 within the coating chamber 12 are preferably formed of a high-temperature alloy, such as a nickel-base alloy such as X-15. Instead of a granular material, the reflectors 80 could be in essentially any form and have essentially any shape. For example, one or more plates coated with a reflective material could be used. As a matter of convenience, the reflectors 80 could be relatively large pieces cut from ingots of a material similar to that being deposited, though it is apparent that other ceramic materials could be used.

As noted above, the ingots 26 of ceramic material are supported within the coating chamber 12 by crucibles 56 that retain the molten pools of ceramic material produced by the electron beams 28. One of the crucibles 56 is shown in greater detail in FIG. 10 as having a three-piece configuration. An upper member 82 with a tapered upper surface 84 is assembled with a lower member 86, forming therebetween a coolant passage 88 through which water or another suitable coolant is flowed to maintain the temperature of the crucible 56 below the melting temperature of its material. A restriction plate 90 is also shown in FIG. 10, whose thickness can be selected to change, e.g., decrease, the cross-sectional flow area of the passage 88 between a coolant inlet 92 and outlet 94. For reasons of thermal conductivity, a preferred material for the crucible 56 is copper or a copper alloy, necessitating that the coolant flow rates through the passage 88 must be sufficient to keep the crucible wall 96 nearest the molten portion of the ingot 26 well below the temperature of the molten ceramic. As is evident from FIG. 10, and as further discussed in reference to FIGS. 11 and 12, the electron beam 28 is preferably projected onto the tapered surface 84 as well as the ingot 26. Consequently, in order for the exterior surface of the upper member 82 to be adequately cooled, the thickness of the wall 96 must be minimized to promote heat transfer without jeopardizing the mechanical strength of the crucible 56. The multiple-piece crucible configuration of this invention facilitates the fabrication of an optimal configuration for the coolant passage 88, as well as enables the thickness of the wall 96 to be produced with tight tolerances. While an optimal configuration will depend on various factors, a preferred coolant flow rate is about five to fifty gallons/minute (about twenty to two hundred liters/minute) using water at a pressure of about two to six atmospheres (about two to six bar) through a passage 88 whose cross-sectional area is about 400 $mm^2$, and with a maximum wall thickness of about 10 mm adjacent the surface 84, and about 7 mm adjacent the ingot 26.

Figure 11:
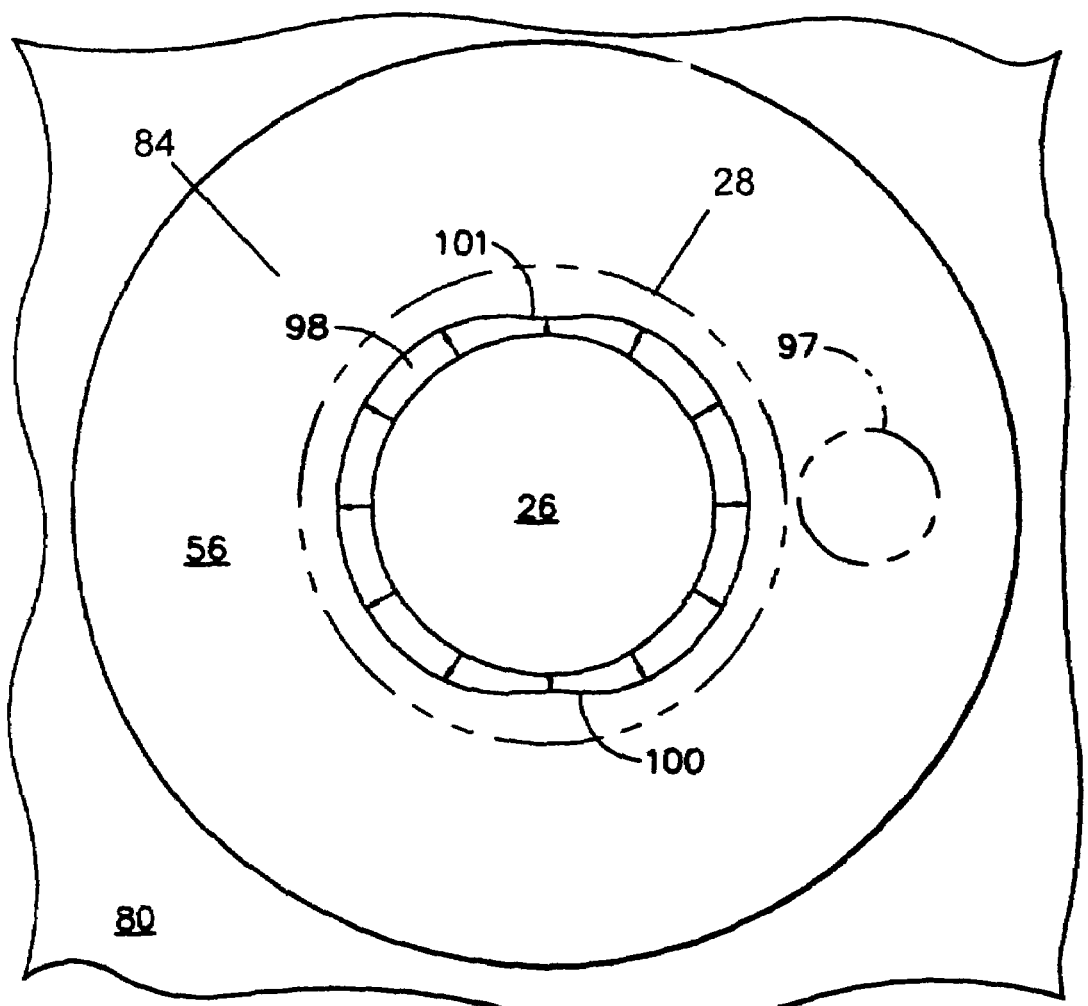
FIG. 11 is a plan view of the crucible of FIG. 10 and a preferred pattern for the electron beam on the crucible and ingot.
Figure 12:
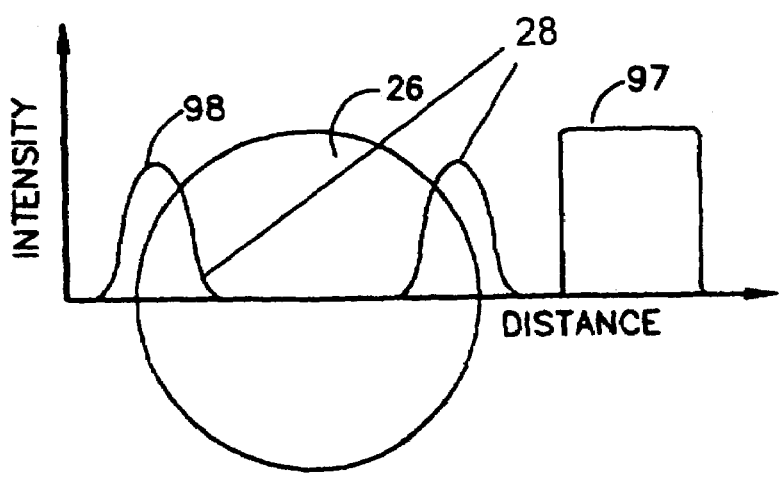
FIG. 12 depicts a preferred power intensity distribution of the electron beam pattern across the surface of the ingot and crucible of FIGS. 10 and 11.

FIGS. 11 and 12 represent a preferred pattern for the electron beams 28 on the ingots 26 to form the pools of ceramic material. As seen in FIGS. 10 and 11, the beam 28 is also projected onto that portion of the crucible surface 84 immediately surrounding the ingot 26, with the perimeter of the beam 28 on the crucible surface 84. The preferred power distribution 98 of the electron beam 28 is shown in FIG. 12 as having peaks located near the ingot-crucible interface, with little or no power aimed at the center of the ingot 26. According to this invention, the benefit of directing such high beam intensities away from the center of the molten pool is a reduced tendency for spitting, which is generally when a droplet of molten ceramic is ejected from the pool during coating. Spitting is associated with defects in the coating produced on the parts 20, and therefore is preferably avoided. Projecting the beam 28 onto the crucible 56 serves to reduce the amount of ceramic that might otherwise buildup on the crucible 56 due to spitting, and also provides a more even temperature distribution across the molten pool as determined with infrared imaging. When YSZ is used as the ingot material, suitable beam intensities at the peaks in FIG. 12 are on the order of about 0.1 $kW/mm^2$, as compared to a maximum level of about 0.01 $kW/mm^2$ at the center of the pool.

Also shown in FIG. 10 is that the electron beam 28 is incident on the surface of the ingot 26 at an oblique angle so as to establish relative to its respective EB gun 30 a proximal intersection point 100 and an oppositely-disposed distal intersection point 101 with the crucible 56 at the perimeter of the beam pattern. As shown in FIG. 11, the preferred beam pattern intensity on the ingot 26 and crucible 56 slightly diminishes, preferably by about 30% to 70% relative to the remaining perimeter of the beam pattern, at locations on the crucible 56 corresponding to the proximal and distal intersection points 100 and 101. The purpose of reducing the intensity of the beam pattern at the proximal intersection point 100 is to reduce erosion of the crucible 56 by the beam 28, while reducing the beam intensity at the distal intersection point 101 has been shown to reduce waves generated by the beam 26 on the molten ceramic pool from pushing molten ceramic over the edge of the crucible 56.

Another preferred control feature of this invention for the electron beams 28 is the ability to temporarily interrupt the beam pattern on the surface of the crucibles 56 with a separate higher-intensity beam pattern 97 dedicated to achieving a faster evaporation rate over a small area in order to evaporate any ceramic that may become deposited on the crucibles 56 as a result of spitting. This feature of the invention can be performed during the coating operation with minimal or no impact on the deposition process. In a preferred embodiment, when the operator initiates an excursion of the separate pattern 97 to evaporate a buildup of ceramic on the crucible 56, the pattern 97 is first automatically repositioned to a known position, from which the pattern 97 can then be manually moved under the direction of the operator toward the ceramic buildup. By automatically returning the pattern 97 to a known position, the likelihood of errors that could lead to damage of the crucible 56 is reduced. Alternatively, the position of the pattern 97 could be preprogrammed so that the operator can enter the location on the crucible 56 onto which the pattern 97 is to be projected. Ceramic buildup on the crucible 56 that cannot be readily removed with the pattern 97 can often be removed with the manipulator 77 shown in FIG. 7.

Magazines 102 that house and feed the ingots 26 up through the floor of the coating chamber 12 and into the crucibles 56 can be seen in FIGS. 1 and 7. As most readily seen in FIGS. 2, 6 and 7, each magazine 102 has a number of cylindrical channels 104 in which the ingots 26 are held. The magazines 102 rotate to index ingots 26 into alignment with the crucibles 56. The magazines 102 can also move toward and away from each other (i.e., laterally relative to the coating chamber 12) in order to make adjustments for crucible separation and thereby optimize the coating zone over which the deviation of coating thickness is acceptable. The feed mechanisms used to grip and feed the ingots 26 into the crucibles 56 generally include clamping arms 60, each of which is disposed at an angle from horizontal and adapted to hold the evaporating ingots 26 in place while the magazine 102 is indexed. The upper end of each arm 60 engages the evaporating ingot 26, which facilitates feeding the ingot 26 in an upward direction with an elevator 61 without allowing the clamping arm 60 to slide downward toward a horizontal position, which was determined to cause jamming of the feed mechanism. According to the invention, each magazine 102 sequentially aligns the next ingot 26 with the lower end of the evaporating ingot 26 within the crucible 56, and the elevator 61 feeds the next ingot 26 into the coating chamber 12 behind the evaporating ingot 26, with no or minimal interruption of the deposition of the ceramic material on the parts 20.

Figure 13:
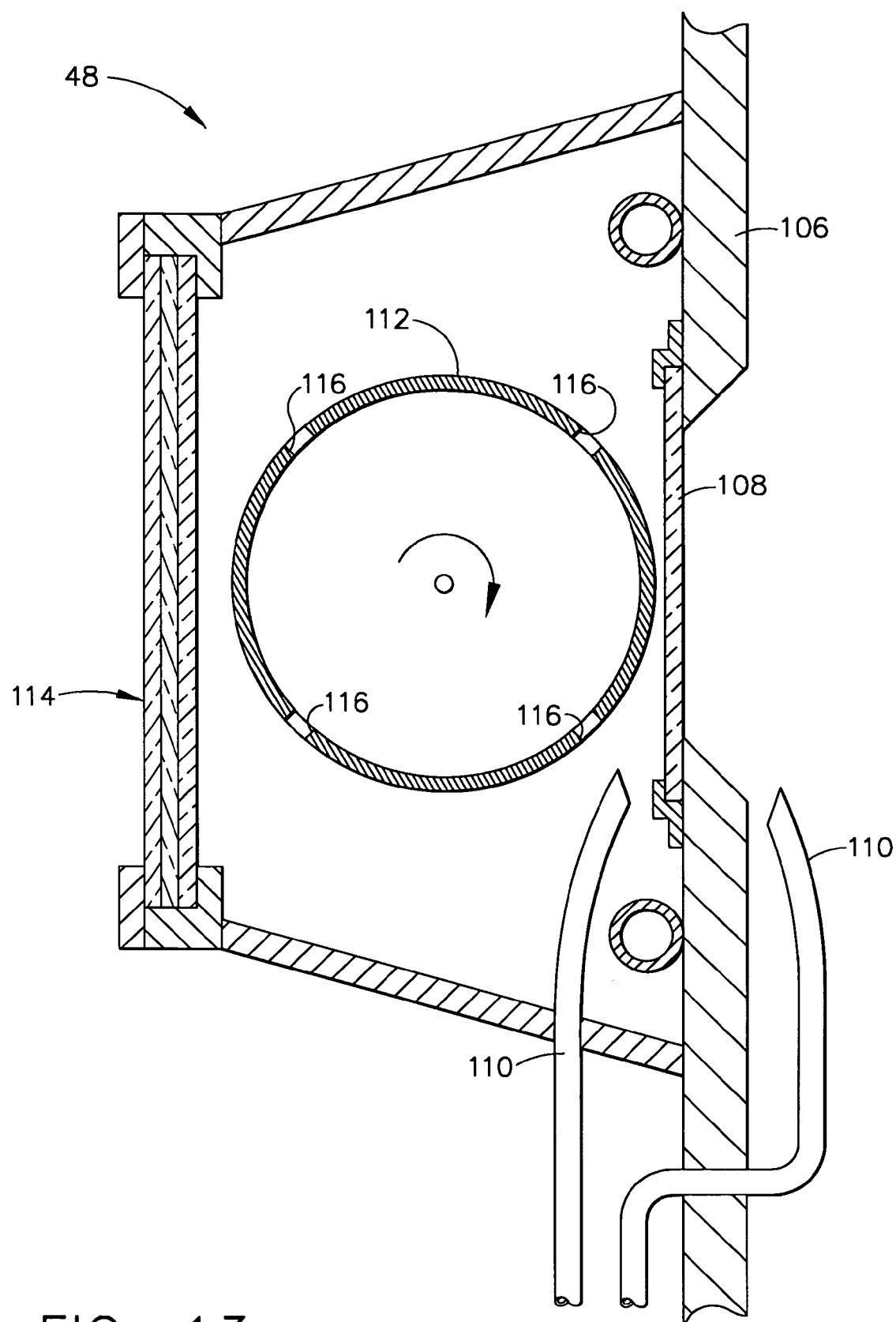
FIG. 13 shows a preferred viewport for observing the process within the coating chamber of the apparatus shown in FIGS. 1 and 2.

The viewport 48 noted in reference to FIGS. 3 through 5 is shown in greater detail in FIG. 13. The viewport 48 is configured to permit the operator of the apparatus 10 to observe the coating operation, including the parts 20 being coated, the pools of molten ceramic, the reflectors 80 around the crucibles 56, and the manipulators 77 used to move the reflectors 80. As shown, the viewport 48 is generally an enclosure that includes a fluid-cooled aperture plate 106 with an optional window 108 formed of sapphire in order to withstand the high temperatures (roughly 800° C. or more) in proximity to the coating process. A shielding gas is shown as being directed toward the aperture plate 106 through a port 110 for the purpose of minimizing coating deposition on the window 108 or equipment behind the aperture plate 106. Within the viewport 48, a rotating stroboscopic drum 112 serves to minimize exposure of a viewing window 114 to radiant heat, light and other radiation from the coating chamber 12. In accordance with known practice, the drum 112 has slots 116 through its wall and rotates at a high rate to eliminate visual flicker to the eye of the observer. The window 114 is preferably a multiple-pane of quartz glass, lead glass and/or colored glass. The quartz glass provides physical strength, the lead glass provides protection from x-rays, and the colored glass is useful to reduce light intensity. The viewport 48 further includes a magnetic particle seal that provides a high-temperature vacuum seal for the stroboscopic drum. Another preferred feature is that the viewport 48 provides a stereoscopic view of the interior of the coating chamber 12, by which one or more operators can simultaneously observe the coating chamber while retaining depth perception.

Figure 14:
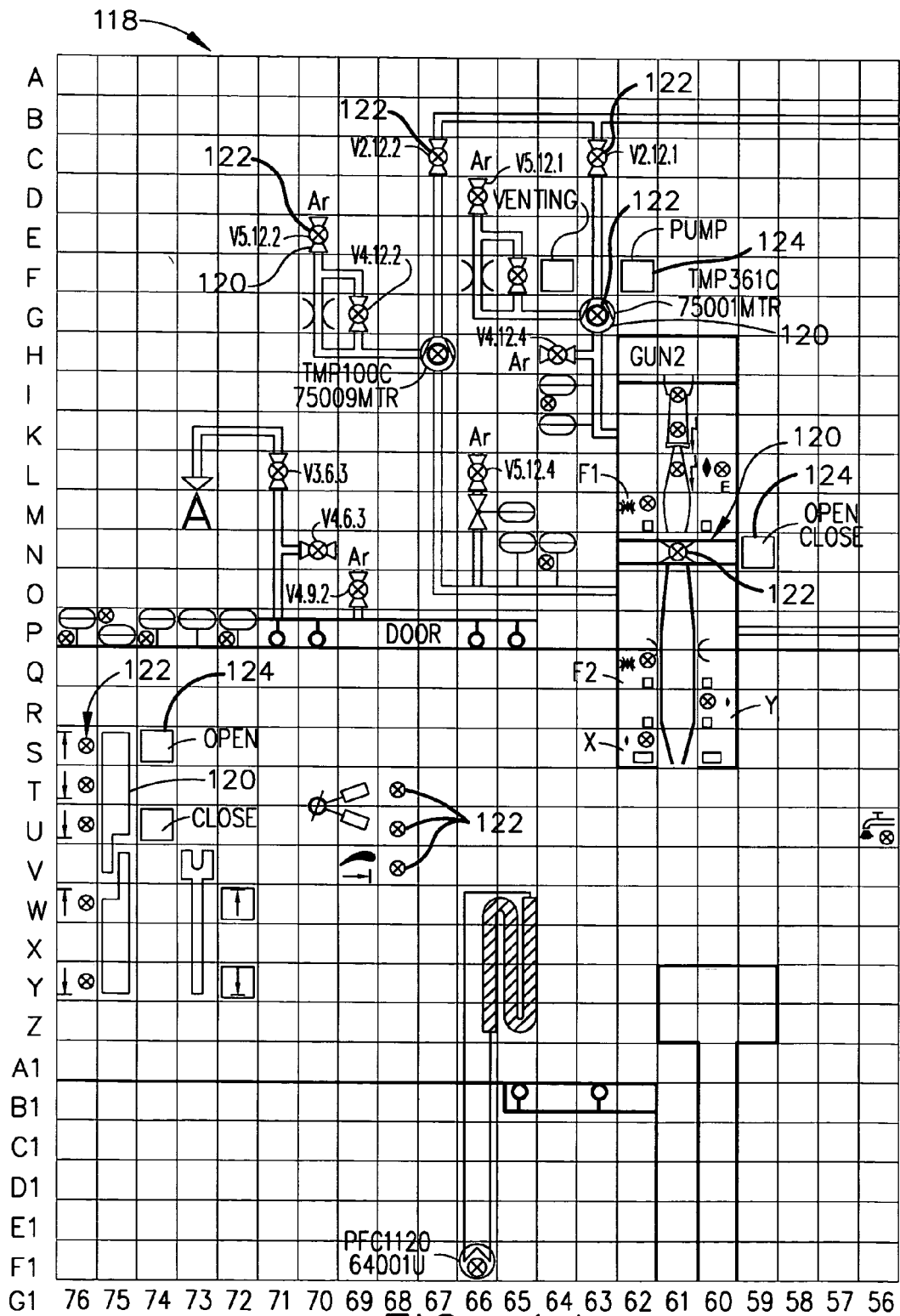
FIG. 14 shows a control panel for monitoring and controlling the operation of the apparatus of FIGS. 1 and 2.

Shown in FIG. 14 is a preferred control panel 118 for controlling and monitoring the EBPVD apparatus 10 of this invention. The control panel 118 is shown as including a schematic of the apparatus 10 and its components, including indicia 120 for individual components (e.g., the coating chamber 12). Also shown are visual indicators 122 located adjacent the indicia 120 for indicating the operating status of the components, and switches 124 to change the operation of the corresponding components. The panel 118 is preferably surrounded by gauges for quantifying process parameters, such as pressures. With the panel 118, information regarding the operating status of the EBPVD apparatus 10 can be quickly and accurately noted to allow the operator to make any appropriate adjustments to the apparatus 10 and the coating process.

In operation, the apparatus 10 of this invention may initially appear as shown in FIGS. 1 and 2. As discussed previously, the parts 20 to be coated are loaded onto the rakes 22 within the loading chambers 16 and 18. The parts 20 may be formed of any suitable material, such as a nickel-base or cobalt-base superalloy if the parts 20 are blades of a gas turbine engine. In the case of gas turbine engine blades, prior to coating with the apparatus 10, the surfaces of the parts will typically be provided with a bond coat of known composition as discussed previously. Also prior to depositing the ceramic TBC, the surface of the bond coat is preferably grit blasted to clean the bond coat surface and produce an optimum surface finish required for depositing columnar EBPVD ceramic coatings. Also prior to depositing the ceramic coating, an alumina scale is preferably formed on the bond coat at an elevated temperature to promote adhesion of the coating. The alumina scale, often referred to as a thermally grown oxide or TGO, develops from oxidation of the aluminum-containing bond coat either through exposure to elevated temperatures prior to or during deposition of the ceramic coating, or by way of a high temperature treatment specifically performed for this purpose. According to this invention, the parts 20 are preferably preheated to about 1100° C. in an argon atmosphere. When not being used to preheat parts 20, the preheat chamber 14 is preferably maintained at about 600° C. to minimize the temperature range to which the chamber 14 is subjected during a campaign.

After preheating within the preheat chamber 14, the rakes 22 are further extended into the coating chamber 12. As previously noted, the apparatus 10 of this invention is particularly configured to deposit a ceramic coating under the elevated pressure conditions taught by Rigney et al. Prior to initiating the coating process, a quick vacuum check is preferably performed to track the pumpdown rate and pressure achieved within each of the coating, preheat and loading chambers 12, 14, 16 and 18 during a set time period. Doing so serves to determine the vacuum integrity of the apparatus 10, which was previously performed with prior art EBPVD operations through an oxidation test performed on sacrificial specimens. The chambers 12, 14, 16 and 18 are evacuated with the mechanical pumps 31 from atmospheric pressure, and then a blower commenced when pressures drop to around 20 mbar. The cryogenic pump 32 is preferably started when a pressure of about $5 \times 10^{-1}$ mbar is reached. Thereafter, the diffusion pumps 32 and 34 are started for the coating and preheat chambers 12 and 14 when a pressure of about $5 \times 10^{-2}$ mbar is reached. Suitable process pressures within the loading and preheat chambers 14, 16 and 18 are about $10^{-3}$ to $10^{-1}$ mbar, with suitable coating pressures being about $10^{-2}$ to about $5 \times 10^{-2}$ mbar within the coating region defined by the hood 52. A dual-element ion gauge 55 provided with a manual shutoff valve 57 is preferably used to measure the vacuum pressure within the coating chamber 12. By using a gauge 55 with independently operable elements, either element can be selected for use without interrupting the coating operation. Alternatively, two ion gauges separated by a valve could be provided, so that either gauge could be used or switched without interrupting the coating operation.

In a preferred aspect of this invention, the cryogenic pump 32 is preferably started prior to the diffusion pump 34, contrary to prior practice in which both pumps 32 and 34 were typically started at the same time to minimize ice buildup on the cryogenic pump 32. Starting the cryogenic pump 32 before the diffusion pump 34 has been found to significantly reduce the amount of time required to attain the coating chamber pressures desired for this invention. While starting the cryogenic pump 32 prior to the diffusion pump 34 promotes ice buildup on the cryogenic pump 32, this ice can be removed at the end of a coating campaign or any other convenient time.

During the coating operation, the electron beams 28 are focused on the ingots 26, thereby forming the molten pools of ceramic and vapors that deposit on the parts 20. While various coating materials could be used, a preferred ceramic material for TBC (and therefore the ingots 26) is zirconia ($ZrO_2$) partially or fully stabilized by yttria (e.g., 3%–20%, preferably 4%–8% $Y_2O_3$), though yttria stabilized with magnesia, ceria, calcia, scandia or other oxides could be used. The coating operation continues until the desired thickness for the coating on the parts 20 is obtained, after which the parts 20 are transferred through the preheat chamber 14 to the loading chamber 16, after which the loading chamber 16 is vented to atmosphere. The vents are preferably at least 30 mm in diameter in order to increase the venting rate, but generally less than about 60 mm in diameter to avoid disturbing dust and other possible contaminants within the chambers 12, 14, 16 and 18. For this reason, it may be desirable to initially vent is with a smaller diameter valve, followed by a larger diameter valve.

While our invention has been described in terms of a preferred embodiment, it is apparent that other forms could be adopted by one skilled in the art. Accordingly, the scope of our invention is to be limited only by the following claims.

What is claimed is:

1. An electron beam physical vapor deposition process performed in a coating chamber at an elevated temperature and a subatmospheric pressure, the coating chamber containing a crucible and a coating material surrounded by and contained within the crucible, the coating material having a surface exposed by the crucible, the process comprising the step of:
    projecting an electron beam onto the surface of the coating material such that a peripheral portion of the electron beam is projected onto a surface portion of the crucible surrounding the coating material, the electron beam defining a beam pattern with a power distribution associated therewith, the power distribution of the beam pattern having a higher intensity at an interface of the surface of the coating material with the surface portion of the crucible than at a central region of the surface of the coating material.

2. An electron beam physical vapor deposition process according to claim 1, wherein the intensity of the power distribution of the beam pattern at the central region of the surface of the coating material is substantially zero.

3. An electron beam physical vapor deposition process according to claim 1, wherein the surface portion of the crucible is contiguous with the surface of the coating material, the power distribution of the beam pattern having a higher intensity on the surface portion of the crucible than at the central region of the surface of the coating material.

4. An electron beam physical vapor deposition process according to claim 1, wherein the electron beam is incident on the surface of the coating material at an oblique angle so as to establish relative to the electron beam gun a proximal point and an oppositely-disposed distal point at the perimeter of the beam pattern, the power distribution of the beam pattern having a lower intensity at the proximal and distal points than elsewhere at the perimeter of the beam pattern.

5. An electron beam physical vapor deposition process according to claim 4, wherein the intensity of the power distribution of the beam pattern at the proximal and distal points is about 30% to about 70% less than the intensity elsewhere at the perimeter of the beam pattern.

6. An electron beam physical vapor deposition process according to claim 1, further comprising the step of projecting a separate beam pattern on the crucible to evaporate droplets of the molten coating material on the crucible, the separate beam pattern having a higher intensity than the beam pattern on the coating material.

7. An electron beam physical vapor deposition process according to claim 1, wherein the coating material comprises zirconia stabilized by yttria and the electron beam is operated to evaporate the coating material and deposit the evaporated coating material on a surface of a gas turbine engine component.

8. An electron beam physical vapor deposition process performed in a coating chamber at an elevated temperature and a pressure greater than 0.010 mbar, the coating chamber containing a crucible and a coating material surrounded by and contained within the crucible, the coating material having a surface exposed by the crucible, the process comprising the steps of:
    projecting an electron beam onto the surface of the coating material and a contiguous surface portion of the crucible, the electron beam forming a beam pattern with a power distribution associated therewith and a perimeter on the contiguous surface portion of the crucible, the electron beam gun melting the surface of the coating material and evaporating molten coating material, the power distribution of the beam pattern having a higher intensity at an interface of the surface of the coating material with the contiguous surface portion of the crucible than at a central region of the surface of the coating material, the electron beam being incident on the surface of the coating material at an oblique angle so as to establish relative to the electron beam gun a proximal point and an oppositely-disposed distal point at the perimeter of the beam pattern, the power distribution of the beam pattern having a lower intensity at the proximal and distal points than elsewhere at the perimeter of the beam pattern; and
    depositing the evaporated molten coating material on a substrate so as to form a coating thereon of the coating material.

9. An electron beam physical vapor deposition process according to claim 8, wherein the intensity of the power distribution of the beam pattern at the central region of the surface of the coating material is substantially zero.

10. An electron beam physical vapor deposition process according to claim 8, wherein the intensity of the power distribution of the beam pattern at the proximal and distal points is about 30% to about 70% less than elsewhere at the perimeter of the beam pattern.

11. An electron beam physical vapor deposition process according to claim 8, further comprising the step of projecting a separate beam pattern on the crucible to evaporate droplets of the molten coating material on the crucible, the separate beam pattern having a higher intensity than the beam pattern on the coating material.

12. An electron beam physical vapor deposition process according to claim 8, wherein the coating material comprises zirconia stabilized by yttria, and the substrate is a surface of a gas turbine engine component.

* * * * *